(12) United States Patent
Izutani et al.

(10) Patent No.: US 11,762,029 B2
(45) Date of Patent: Sep. 19, 2023

(54) INSULATION RESISTANCE DETECTION APPARATUS

(71) Applicant: DENSO TEN Limited, Kobe (JP)

(72) Inventors: Atsushi Izutani, Kobe (JP); Yoshihiro Nakao, Kobe (JP)

(73) Assignee: DENSO TEN Limited, Kobe (JP)

( * ) Notice: Subject to any disclaimer, the term of this patent is extended or adjusted under 35 U.S.C. 154(b) by 0 days.

(21) Appl. No.: 17/697,569

(22) Filed: Mar. 17, 2022

(65) Prior Publication Data

US 2023/0204677 A1 Jun. 29, 2023

(30) Foreign Application Priority Data

Dec. 23, 2021 (JP) ................................. 2021-209733

(51) Int. Cl.
*G01R 31/389* (2019.01)
*H02J 7/00* (2006.01)
*G01R 31/52* (2020.01)
*G01R 31/388* (2019.01)

(52) U.S. Cl.
CPC ......... *G01R 31/389* (2019.01); *G01R 31/388* (2019.01); *G01R 31/52* (2020.01); *H02J 7/0024* (2013.01)

(58) Field of Classification Search
None
See application file for complete search history.

(56) References Cited

U.S. PATENT DOCUMENTS

2007/0285057 A1\* 12/2007 Yano .................... B60L 3/12
320/116

FOREIGN PATENT DOCUMENTS

DE 102005024198 B4 7/2013
JP 2003-066090 A 3/2003

\* cited by examiner

*Primary Examiner* — Jas A Sanghera
(74) *Attorney, Agent, or Firm* — Oliff PLC

(57) ABSTRACT

An insulation resistance detection apparatus includes: a first switch connected to a high potential side of a battery assembly including plural battery cells connected in series; a second switch connected to a low potential side of the battery assembly; a detection resistor; a controller configured to turn on one of the first switch and the second switch and turn off the other of the first switch and the second switch to form a series connection circuit including the battery assembly, an insulation resistor of the battery assembly, and the detection resistor, and calculate insulation resistance based on a voltage applied to the detection resistor, in which the first switch is connected between two battery cells on the high potential side among the plural battery cells.

8 Claims, 4 Drawing Sheets

INSULATION RESISTANCE DETECTION APPARATUS

CROSS-REFERENCE TO RELATED APPLICATIONS

This application is based upon and claims the benefit of priority from prior Japanese patent application No. 2021-209733, filed on Dec. 23, 2021, the entire contents of which are incorporated herein by reference.

TECHNICAL FIELD

An embodiment disclosed herein relates to an insulation resistance detection apparatus.

BACKGROUND ART

There is an insulation resistance detection apparatus that includes a measurement unit and detects insulation resistance of a battery. The measurement unit includes a first switch connected to a positive electrode side of the battery, a second switch connected to a negative electrode side, a detection resistor, and a measurement circuit that measures the voltage applied to the detection resistor (for example, see JP-A-2003-66090).

The insulation resistance detection apparatus turns on one of the first switch and the second switch and turns off the other switch to form a series connection circuit including the battery, an insulation resistor of the battery, and the detection resistor, and detects the insulation resistance of the battery based on the voltage measured by the measurement circuit.

SUMMARY OF INVENTION

Technical Problem

With an increase in the voltage of batteries in recent years, it is necessary to increase the breakdown voltage of switches of insulation resistance detection apparatuses, which increases the cost.

An aspect of the embodiment is made in view of the above circumstance, and an object of the embodiment is to provide an insulation resistance detection apparatus that can reduce the cost of a switch.

Solution to Problem

According to an aspect of the embodiment there is provided an insulation resistance detection apparatus including: a first switch connected to a high potential side of a battery assembly including plural battery cells connected in series; a second switch connected to a low potential side of the battery assembly; a detection resistor; a controller configured to turn on one of the first switch and the second switch and turn off the other of the first switch and the second switch to form a series connection circuit including the battery assembly, an insulation resistor of the battery assembly, and the detection resistor, and calculate insulation resistance based on a voltage applied to the detection resistor, in which the first switch is connected between two battery cells on the high potential side among the plural battery cells.

Advantageous Effects of Invention

The insulation resistance detection apparatus according to the aspect of the embodiment can reduce the cost of a switch.

DESCRIPTION OF EMBODIMENTS

Hereinafter, an embodiment of an insulation resistance detection apparatus and a failure detection method will be described in detail with reference to the accompanying drawings. The present invention is not limited to the following embodiment. The insulation resistance detection apparatus according to the embodiment is mounted on a vehicle that travels using a driving force of an electric motor, such as an electric vehicle or a hybrid vehicle.

As a battery that supplies electric power to the electric motor of the vehicle, a high-voltage secondary battery (for example, a lithium ion battery) that outputs a high voltage of hundreds of volts or more is used. An electric leakage of such a battery may cause an electric shock or the like.

For this reason, the battery is housed in an insulating case or the like and is electrically insulated from the outside. A newly used battery case has a resistance value in an order of MΩ and almost no electricity passes therethrough. However, the insulation performance of the battery case may deteriorate due to aging or the like. For this reason, the insulation resistance detection apparatus detects and monitors, for example, insulation resistance of the case that is insulation resistor of the battery.

[1. Configuration Example of Insulator Resistance Detection Apparatus]

Figure 1:
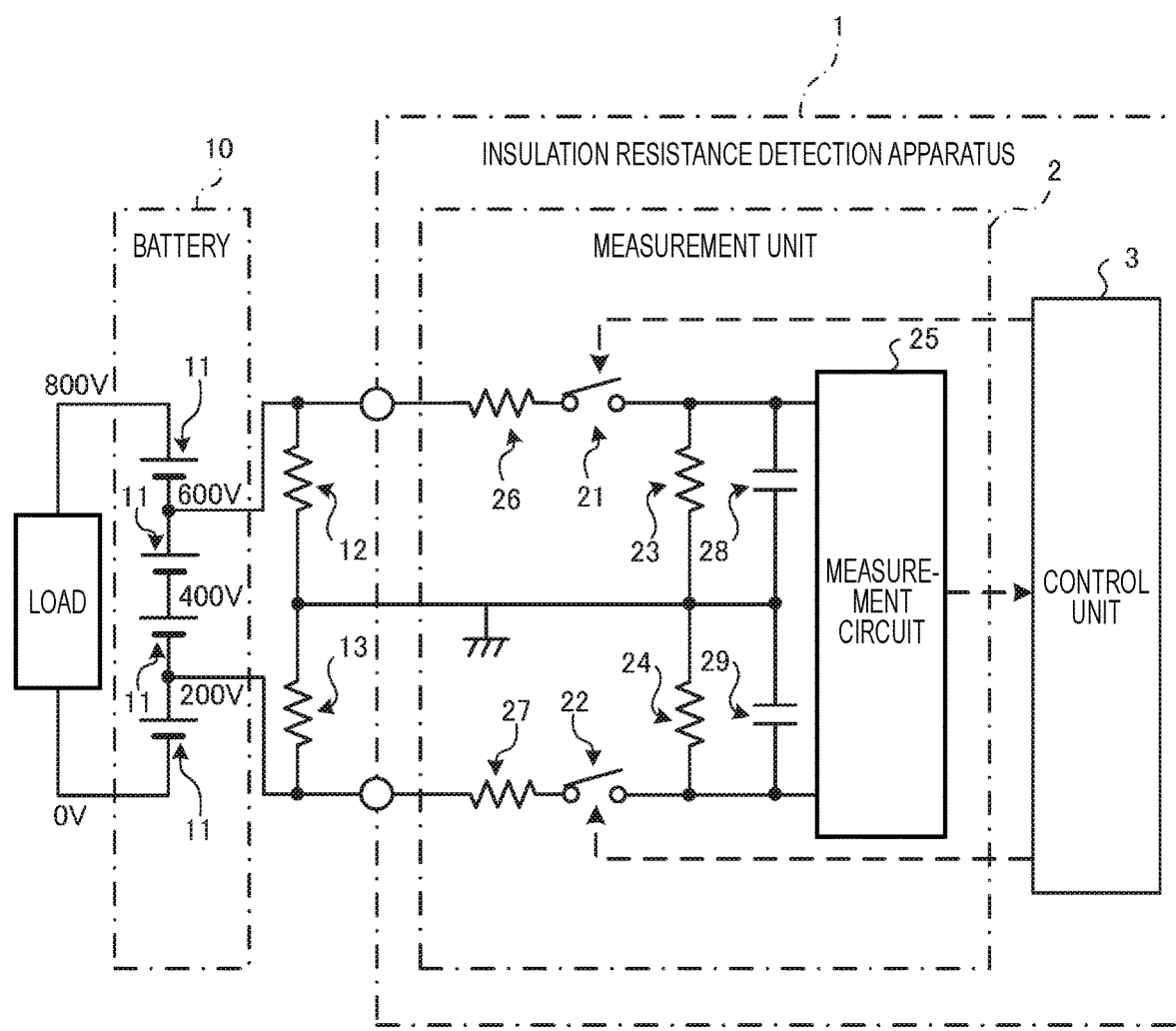
FIG. 1 is a schematic diagram showing a configuration example of an insulation resistance detection apparatus according to an embodiment.

FIG. 1 is a schematic diagram showing a configuration example of an insulation resistance detection apparatus 1 according to the embodiment. As shown in FIG. 1, the insulation resistance detection apparatus 1 is connected to a battery 10 through an insulation resistor 12 on a high voltage side and an insulation resistor 13 on a low voltage side. The battery 10 includes plural battery cells 11 connected in series. Here, the battery 10 including four battery cells 11 connected in series will be described as an example. Each of the four battery cells 11 outputs 200 V. That is, in the present embodiment, the output voltage of the battery 10 is 800 V. The number of the battery cells 11 included in the battery 10 is not limited to four.

The insulation resistor 12 on the high voltage side and the insulation resistor 13 on the low voltage side are not resistance elements but are parts of an insulating case that houses the battery 10 in the present embodiment. The insulation resistor 12 on the high voltage side and the insulation resistor 13 on the low voltage side may be resistance elements that electrically insulate the battery 10 from the outside of the battery 10.

The insulation resistance detection apparatus 1 includes a measurement unit 2 and a control unit 3. The measurement unit 2 includes a first switch 21 connected to a positive electrode side of the battery 10, a second switch 22 connected to a negative electrode side of the battery 10, detection resistors 23, 24, and a measurement circuit 25 that measures the voltage applied to the detection resistors 23, 24. The measurement unit 2 further includes limiting resistors 26, 27, and capacitors 28, 29 connected in parallel to the detection resistors 23, 24, respectively.

Here, when the first switch 21 is connected to a positive electrode of the battery 10 and the second switch 22 is connected to the negative electrode of the battery 10, for example, the first switch 21 and the second switch 22 are required to have a breakdown voltage of 800 V. In general, the higher the breakdown voltage, the more expensive a switch is.

Therefore, the first switch 21 of the insulation resistance detection apparatus 1 is connected between the two battery cells 11 on a high potential side of the battery 10. Accordingly, the breakdown voltage required for the first switch 21 of the insulation resistance detection apparatus 1 may be reduced to be lower than 800 V and the cost may be reduced.

The second switch 22 of the insulation resistance detection apparatus 1 is connected between the two battery cells 11 on a low potential side of the battery 10. Accordingly, the breakdown voltage required for the second switch 22 of the insulation resistance detection apparatus 1 may be reduced to be lower than 800 V and the cost may be reduced.

Examples of voltage applied to the first switch 21 and the second switch 22 during operation of the insulation resistance detection apparatus 1 will be described below with reference to FIGS. 2 and 3. In the insulation resistance detection apparatus 1, the first switch 21 may be connected between the two battery cells 11 on the high potential side of the battery 10, and the second switch 22 may be connected to the negative electrode of the battery 10. In this case, the breakdown voltage required for the first switch 21 of the insulation resistance detection apparatus 1 may be reduced to be lower than 800 V and the cost may be reduced.

In the insulation resistance detection apparatus 1, the first switch 21 may be connected to the positive electrode of the battery 10, and the second switch 22 may be connected between the two battery cells 11 on the low potential side of the battery 10. In this case, the breakdown voltage required for the second switch 22 of the insulation resistance detection apparatus 1 may be reduced to be lower than 800 V and the cost may be reduced.

The control unit 3 includes various circuits and a microcomputer including a central processing unit (CPU), a read only memory (ROM), a random access memory (RAM), and the like. The control unit 3 controls the first switch 21 and the second switch 22 by the CPU executing a program stored in the ROM using the RAM as a work area.

The control unit 3 turns on one of the first switch 21 and the second switch 22 and turns off the other switch to form a series connection circuit including the battery 10, the insulation resistors 12, 13 of the battery 10, and the detection resistors 23, 24, and calculates the insulation resistors 12, 13 based on the voltage measured by the measurement circuit 25. Specific examples of operation of the control unit 3 will be described below with reference to FIGS. 2 and 3.

A part or all of the control unit 3 may be hardware such as an application specific integrated circuit (ASIC) or a field programmable gate array (FPGA).

[2. Operation During Insulation Resistance Detection]

Next, operation examples of the insulation resistance detection apparatus 1 will be described with reference to FIGS. 2 and 3. FIGS. 2 and 3 are schematic diagrams showing the operation examples of the insulation resistance detection apparatus 1 according to the embodiment.

Figure 2:
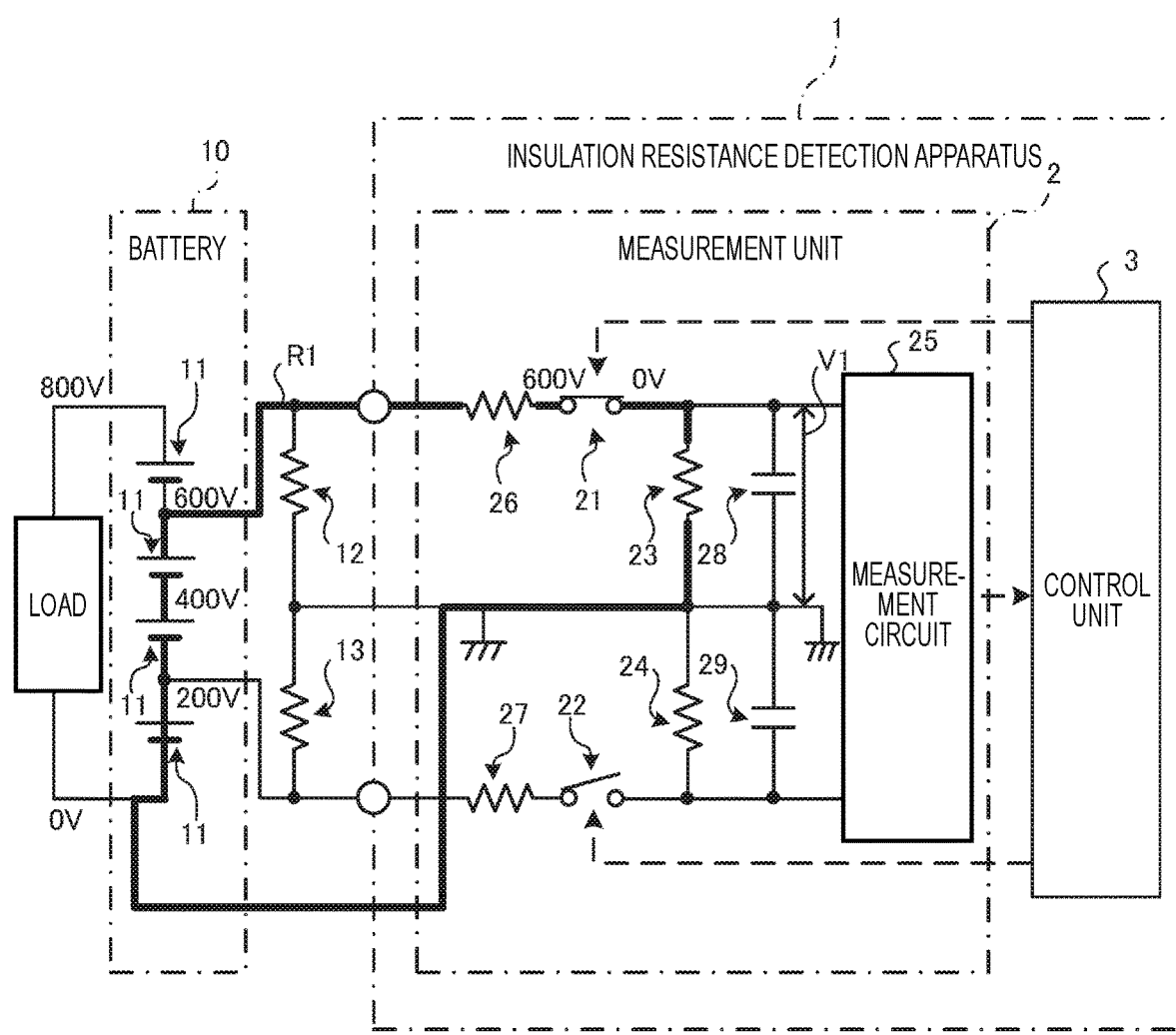
FIG. 2 is a schematic diagram showing an operation example of the insulation resistance detection apparatus according to the embodiment.

For example, when detecting a resistance value of the insulation resistor 13 on the low voltage side, as shown in FIG. 2, the control unit 3 turns on the first switch 21 and turns off the second switch 22 to form a first series connection circuit R1 including the battery 10, the limiting resistor 26, the detection resistor 23, and the insulation resistor 13 on the low voltage side. Then, the measurement circuit 25 measures a voltage (voltage difference between both ends of the detection resistor 23) V1 applied to the detection resistor 23, and outputs a measurement result to the control unit 3.

At this time, almost no current flows through the first series connection circuit R1 if the resistance value of the insulation resistor 13 on the low voltage side is sufficiently large. In this case, the voltage V1 measured by the measurement circuit 25 has a value close to 0 V. In contrast, current flows through the first series connection circuit R1 when the resistance value of the insulation resistor 13 on the low voltage side is lowered. The lower the resistance of the insulation resistor 13 on the low voltage side, the higher the voltage V1 measured by the measurement circuit 25 is.

For this reason, the control unit 3 calculates the resistance value of the insulation resistor 13 on the low voltage side based on the voltage V1 measured by the measurement circuit 25, and determines that there is no electric leakage when the calculated resistance value is equal to or larger than a predetermined resistance value. When the calculated resistance value is smaller than the predetermined resistance value, the control unit 3 determines that there is an electric leakage. When it is determined that there is an electric leakage, the control unit 3 warns a user of the electric leakage with a warning device such as a warning lamp.

At this time, a terminal voltage of the first switch 21 on the battery 10 side is 600 V, and a terminal voltage of the first switch 21 on the measurement circuit 25 side is 0 V. For this reason, the breakdown voltage of the first switch 21 may be 600 V.

Accordingly, the insulation resistance detection apparatus 1 can adopt the first switch 21 of a low cost having a breakdown voltage (600 V) lower than the breakdown voltage (800 V) required for the first switch 21 when the first switch 21 is connected to the positive electrode of the battery 10.

Figure 3:
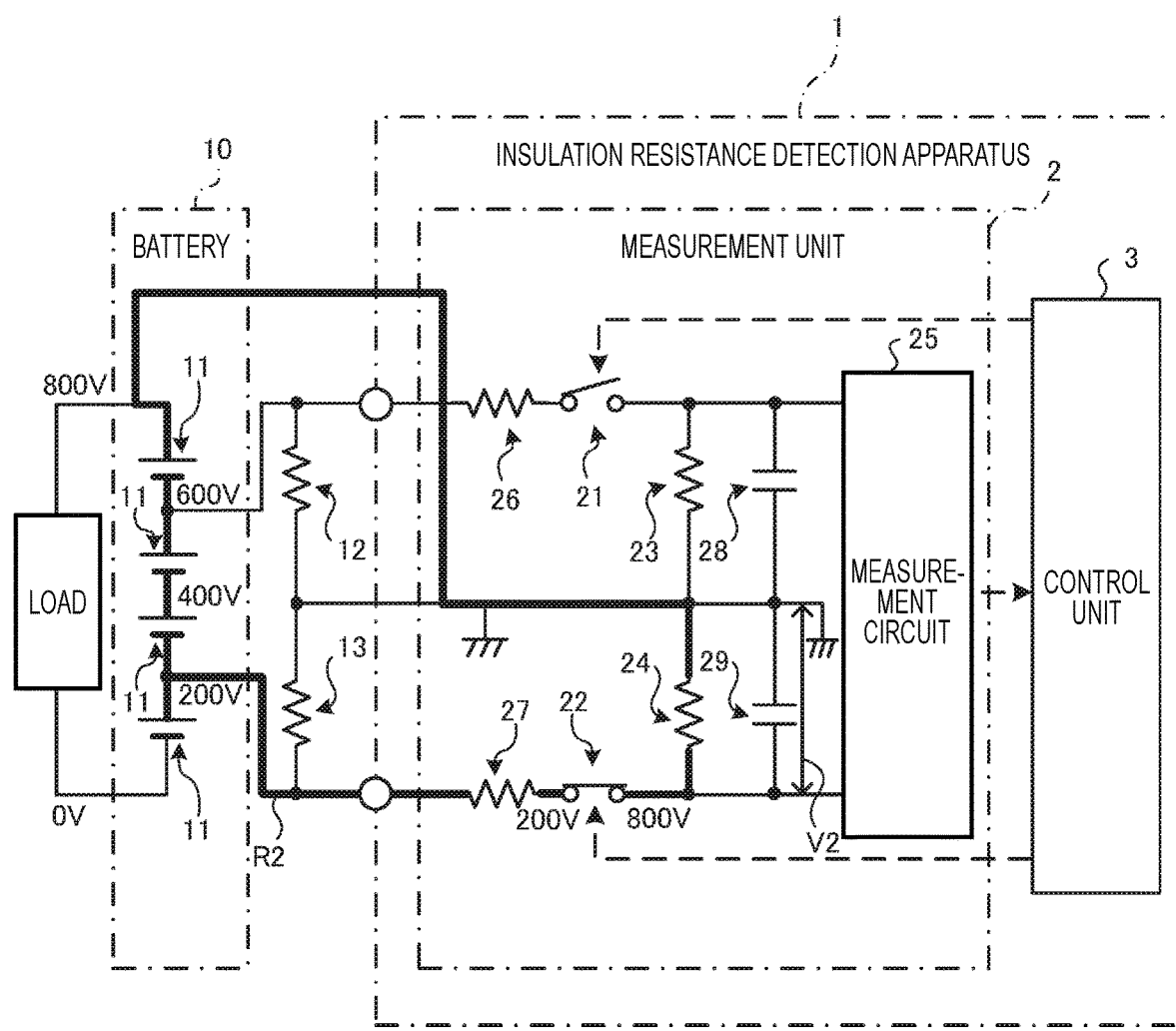
FIG. 3 is a schematic diagram showing an operation example of the insulation resistance detection apparatus according to the embodiment.

In addition, when detecting a resistance value of the insulation resistor 12 on the high voltage side, as shown in FIG. 3, the control unit 3 turns off the first switch 21 and turns on the second switch 22 to form a second series connection circuit R2 including the battery 10, the insulation resistor 12 on the high voltage side, the detection resistor 24, and the limiting resistor 27. Then, the measurement circuit 25 measures a voltage (voltage difference between both ends of the detection resistor 24) V2 applied to the detection resistor 24, and outputs a measurement result to the control unit 3.

At this time, almost no current flows through the second series connection circuit R2 if the resistance value of the insulation resistor 12 on the high voltage side is sufficiently large. In this case, the voltage V2 measured by the measurement circuit 25 has a value close to 0 V. In contrast, current flows through the second series connection circuit R2 when the resistance value of the insulation resistor 12 on the high voltage side is lowered. The lower the resistance of the insulation resistor 12 on the high voltage side, the higher the voltage V2 measured by the measurement circuit 25 is.

For this reason, the control unit 3 calculates the resistance value of the insulation resistor 12 on the high voltage side based on the voltage V2 measured by the measurement circuit 25, and determines that there is no electric leakage when the calculated resistance value is equal to or larger than a predetermined resistance value. When the calculated resistance value is smaller than the predetermined resistance value, the control unit 3 determines that there is an electric leakage. When it is determined that there is an electric leakage, the control unit 3 warns the user of the electric leakage with a warning device such as a warning lamp.

At this time, a terminal voltage of the second switch 22 on the measurement circuit 25 side is 800 V when the positive electrode of the battery 10 is short-circuited to the ground. On the other hand, a terminal voltage of the second switch 22 on the battery 10 side is 200 V. For this reason, the breakdown voltage of the second switch 22 may be 600 V.

Accordingly, the insulation resistance detection apparatus 1 can adopt the second switch 22 of a low cost having a breakdown voltage (600 V) lower than the breakdown voltage (800 V) required for the second switch 22 when the second switch 22 is connected to the negative electrode of the battery 10.

[3. Process Executed by Control Unit]

Figure 4:
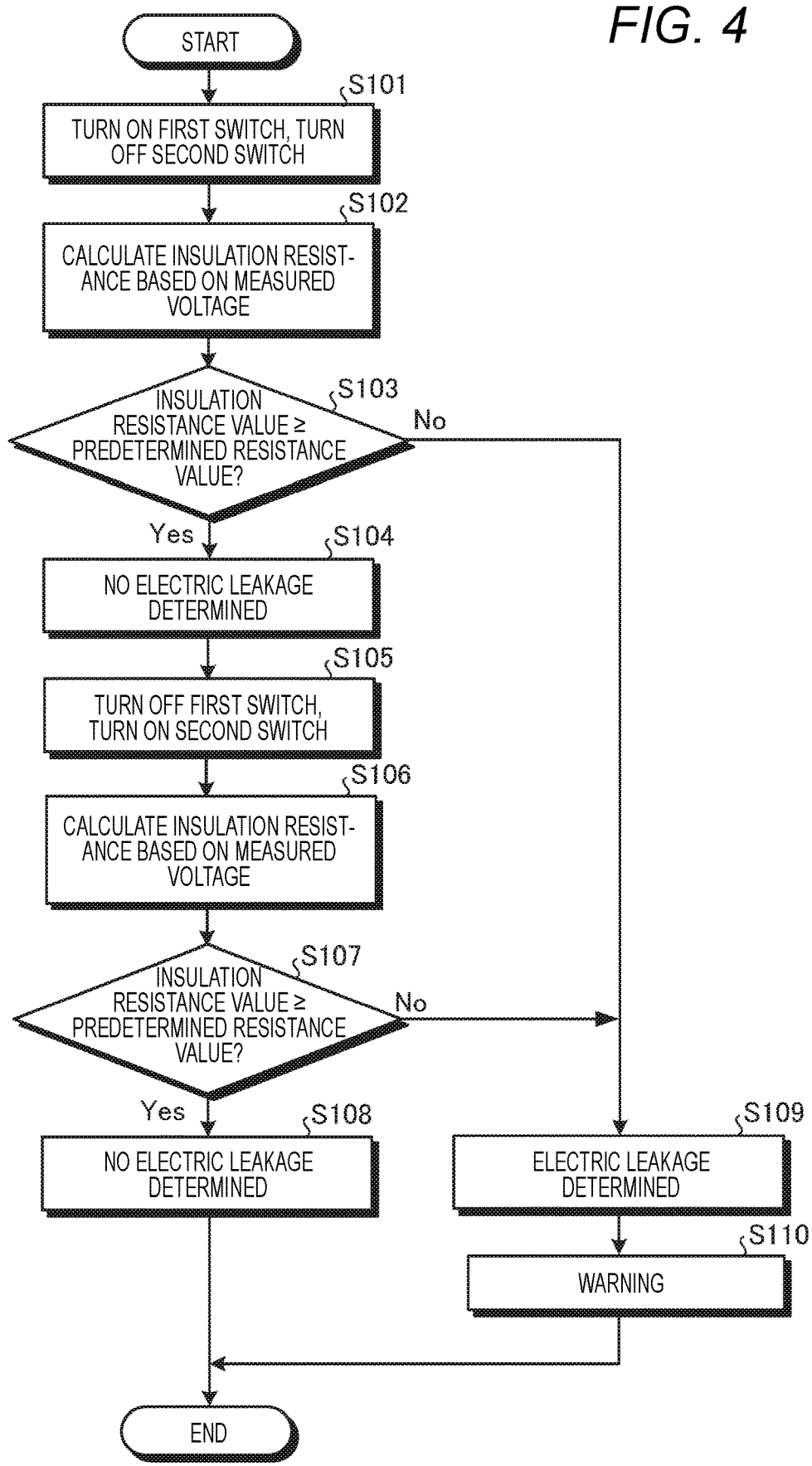
FIG. 4 is a flowchart showing an example of a process performed by a control unit according to the embodiment.

Next, a process executed by the control unit 3 will be described with reference to FIG. 4. FIG. 4 is a flowchart showing an example of the process executed by the control unit 3 according to the embodiment. The control unit 3 repeatedly executes the process shown in FIG. 4 when a power supply of the vehicle is on.

Specifically, as shown in FIG. 4, the control unit 3 first turns on the first switch 21 and turns off the second switch 22 to form the first series connection circuit R1 (step S101). Then, the control unit 3 calculates the insulation resistance value of the insulation resistor 13 based on the voltage measured by the measurement unit 2 (step S102), and determines whether the insulation resistance value is equal to or larger than a predetermined resistance value that causes no problem in insulation of the battery 10 (step S103).

When the control unit 3 determines that the insulation resistance value is equal to or larger than the predetermined resistance value (step S103, Yes), the control unit 3 determines that there is no electric leakage (step S104). Thereafter, the control unit 3 turns off the first switch 21 and turns on the second switch 22 to form the second series connection circuit R2 (step S105).

Then, the control unit 3 calculates the insulation resistance value of the insulation resistor 12 based on the voltage measured by the measurement unit 2 (step S106), and determines whether the insulation resistance value is equal to or larger than a predetermined resistance value that causes no problem in insulation of the battery 10 (step S107).

When it is determined that the insulation resistance value is equal to or larger than the predetermined resistance value (step S107, Yes), the control unit 3 determines that there is no electric leakage (step S108), ends the process, and starts the process from step S101 again.

When it is determined in step S103 or S107 that the insulation resistance value is not equal to or larger than the predetermined resistance value (No in step S103 or No in step S107), the control unit 3 determines that there is an electric leakage (step S109). Thereafter, the control unit 3 warns the user of the electric leakage (step S110), ends the process, and starts the process again from step S101.

What is claimed is:

1. An insulation resistance detection apparatus comprising:
   a first switch connected to a high potential side of a battery assembly including a plurality of battery cells connected in series;
   a second switch connected to a low potential side of the battery assembly;
   a detection resistor; and
   a controller configured to
      turn on one of the first switch and the second switch and turn off the other of the first switch and the second switch to form a series connection circuit including the battery assembly, an insulation resistor of the battery assembly, and the detection resistor, and
      calculate insulation resistance based on a voltage applied to the detection resistor, wherein
   the first switch is connected between two battery cells on the high potential side among the plurality of battery cells, and
   the second switch is connected between two battery cells on the low potential side among the plurality of battery cells.

2. The insulation resistance detection apparatus according to claim 1, wherein
   the insulation resistor is at least a part of an insulating case that houses the battery assembly.

3. The insulation resistance detection apparatus according to claim 1, wherein
   the controller is configured to determine whether there is an electric leakage based on the calculated insulation resistance.

4. The insulation resistance detection apparatus according to claim 3, wherein
   the controller is configured to warn a user using a warning device in response to the electric leakage being determined.

5. An insulation resistance detection method comprising:
   connecting a first switch that is connected to a high potential side of a battery assembly including a plurality of battery cells connected in series between two battery cells on the high potential side among the plurality of battery cells;
   connecting a second switch that is connected to a low potential side of the battery assembly between two battery cells on the low potential side among the plurality of battery cells;
   turning on one of the first switch and the second switch and turning off the other of the first switch and the second switch to form a series connection circuit including the battery assembly, an insulation resistor of the battery assembly, and a detection resistor; and
   calculating insulation resistance based on a voltage applied to the detection resistor.

6. The insulation resistance detection method according to claim 5, wherein
   the insulation resistor is at least a part of an insulating case that houses the battery assembly.

7. The insulation resistance detection method according to claim 5, further comprising:
   determining whether there is an electric leakage based on the calculated insulation resistance.

8. The insulation resistance detection method according to claim 7, further comprising:
   warning a user using a warning device in response to the electric leakage being determined.

* * * * *